United States Patent [19]
Euchner et al.

[11] Patent Number: 5,409,419
[45] Date of Patent: Apr. 25, 1995

[54] VENTILATOR INSERT

[75] Inventors: Heinz Euchner, Birkenfeld; Heinz Kempf, Calw-Altenburg, both of Germany

[73] Assignee: Schroff GmbH, Straubenhardt, Germany

[21] Appl. No.: 43,704

[22] Filed: Apr. 8, 1993

[30] Foreign Application Priority Data

Apr. 8, 1992 [DE] Germany .................. 42 11 759.3

[51] Int. Cl.⁶ .............................................. H05K 7/20
[52] U.S. Cl. ..................................... 454/184; 361/695
[58] Field of Search ............... 361/694, 695; 454/184; 363/141; 174/16.1

[56] References Cited

U.S. PATENT DOCUMENTS

| | | | |
|---|---|---|---|
| 2,825,500 | 3/1958 | McLean | 454/338 X |
| 4,158,875 | 6/1979 | Tajima et al. | 361/695 |
| 4,648,007 | 3/1987 | Garner | 361/695 |
| 4,754,397 | 6/1988 | Varaiya et al. | 361/694 X |
| 4,907,645 | 3/1990 | Dumas et al. | 361/695 X |
| 5,207,613 | 5/1993 | Ferchau et al. | 454/184 |

FOREIGN PATENT DOCUMENTS

| | | |
|---|---|---|
| 2409683 | 9/1975 | Germany . |
| 2416103 | 10/1975 | Germany . |
| 2449068 | 4/1976 | Germany . |
| 8029450 | 3/1981 | Germany . |
| 8305869 | 12/1983 | Germany . |
| 8510847 | 7/1985 | Germany . |
| 3717796 | 12/1988 | Germany . |
| 9001929 | 6/1990 | Germany . |

Primary Examiner—Harold Joyce
Attorney, Agent, or Firm—Spencer, Frank & Schneider

[57] ABSTRACT

A ventilator insert for cooling electronic components in cabinets and racks, the insert including a ventilator housing provided with a cover plate and a front plate. A plurality of blowers are held in the cover plate. The blowers are supplied with air by way of different air intake channels whose inputs constitute partial regions of the inlet opening and start at the front plate. Each row of blowers has an associated separate air intake channel. By differently dimensioning the entrance cross sections of the air intake channels, the cooling air discharged by the ventilator insert can be adapted to requirements while ensuring uniform cooling of the components.

9 Claims, 2 Drawing Sheets

VENTILATOR INSERT

BACKGROUND OF THE INVENTION

The present invention relates to a ventilator insert for cooling electronic components in cabinets and racks, the insert comprising a ventilator housing that includes a cover plate and a front plate, with an inlet opening being disposed in the front plate. The insert further includes at least two electric blowers that are disposed underneath outlet openings in the cover plate.

When electronic components are used in cabinets and racks, it is necessary to dissipate the heat generated by the components. The dissipation of heat by natural convection is insufficient in many cases. It is therefore absolutely necessary to employ ventilating fans, heat exchangers or cooling devices. In each case it is important that the incoming air is distributed as uniformly as possible to the component groups so that cooling of all components is ensured.

As known, for example, in DE 3,717,796, cabinets and racks for electronic devices are cooled by means of ventilator inserts which suck in cool air at their frontal face by means of several electric blowers and cool the components disposed thereabove by means of the upwardly discharged incoming air. The heated discharged air is then removed from the top of the components, for example, toward the rear. In this manner of proceeding, it has been found that especially the supply of incoming air to the rear portions of the components poses problems. The reason for this are the longer suction paths. Particularly if there are a plurality of blowers or rows of blowers that are arranged one behind the other in the insertion direction, the effect of irregular cooling is very distinct. It is possible to obtain a uniform distribution by establishing a pressure chamber between the blowers and the components but this requires a relatively large amount of space.

SUMMARY OF THE INVENTION

Based on the above-described state of the art, it is an object of the present invention to provide a ventilator insert for cooling electronic components in cabinets or racks. The ventilator insert comprises a ventilator housing provided with a cover plate and a front plate, with an inlet opening being disposed in the front plate. The insert further includes at least two electric blowers disposed below outlet openings in the cover plate and is designed in such a way that all component portions can be cooled uniformly. In particular, it is to be possible to sufficiently cool the component portions disposed in the region of the rear wall of the cabinets and racks. In addition, the ventilator insert is to take up only a low height when installed.

This is accomplished according to the invention in that each blower has a separate associated air intake channel whose entrance starts at the inlet opening. Thus different quantities of air in specific local distributions can be blown from the bottom into the components and cool them.

In one advantageous embodiment, the blowers are arranged next to one another at a right angle to the insertion direction. This permits an optimal response to special cooling requirements that, for example, have a gradient in a direction transverse to the insertion direction.

Preferably, the blowers lie one behind the other in the insertion direction. This embodiment is designed to handle the problems of the normally poor cooling of the rear component portions and ensures a uniform supply of cooling air.

The inlets of the air intake channels in the inlet opening may be provided next to one another. This arrangement is appropriate, for example, if the blowers are likewise arranged next to one another.

In an alternative embodiment, the inlets of the air intake channels may be superposed in the inlet opening. Such an embodiment is appropriate, for example, for blowers that are arranged one behind the other. Of course, other combinations of inlet opening subdivisions with respect to the arrangement of the blowers are also conceivable.

Advisably the air intake channels are formed by partitions in the ventilator housing. It is favorable to provide appropriately angled sheet metal plates as the partitions whose edges are fastened in the interior of the ventilator housing.

Advantageously, the intake cross sections of the air intake channels of the front blowers are smaller than the intake cross sections of the air intake channels leading to the rear blowers. The shorter suction path is compensated by the smaller intake cross section as is the long suction path by the larger intake cross section. With this selection of dimensions for the intake cross sections, it is possible to realize a uniform distribution of the cooling air to all parts of the electronic components seated above the ventilator insert. Thus a pressure chamber disposed between the blowers and the components, which had been used in the past to ensure uniform distribution of the cooling air, is now no longer necessary. Other distributions of the cooling air can also be realized to correspond to the respective requirements given by the electronic components.

In a preferred embodiment, the blowers are axial blowers. Axial blowers have the advantage of not requiring much space with respect to their installed height.

In another embodiment, the blowers may be tangential blowers.

In a further embodiment, the blowers may also be radial blowers.

Advisably, a grate is provided upstream of the inlet opening. Such a grate serves as a protection against contact.

In an advantageous embodiment, a filter medium is disposed upstream of the inlet opening, for example a filter medium of synthetic fibers. The purpose of the filter medium is to keep dust particles and the like away from the electronic components so that their proper operation is not adversely affected.

A laminar air guide may be fastened to the front plate of the ventilator insert. The laminar air guide provides the optimum air intake angle for the air intake channels, protects against water sprays and additionally meets aesthetic requirements.

BRIEF DESCRIPTION OF THE DRAWINGS

The invention will now be described in greater detail for a preferred embodiment thereof and with reference to the attached drawings, in which.

DETAILED DESCRIPTION OF THE PREFERRED EMBODIMENT

Figure 1:
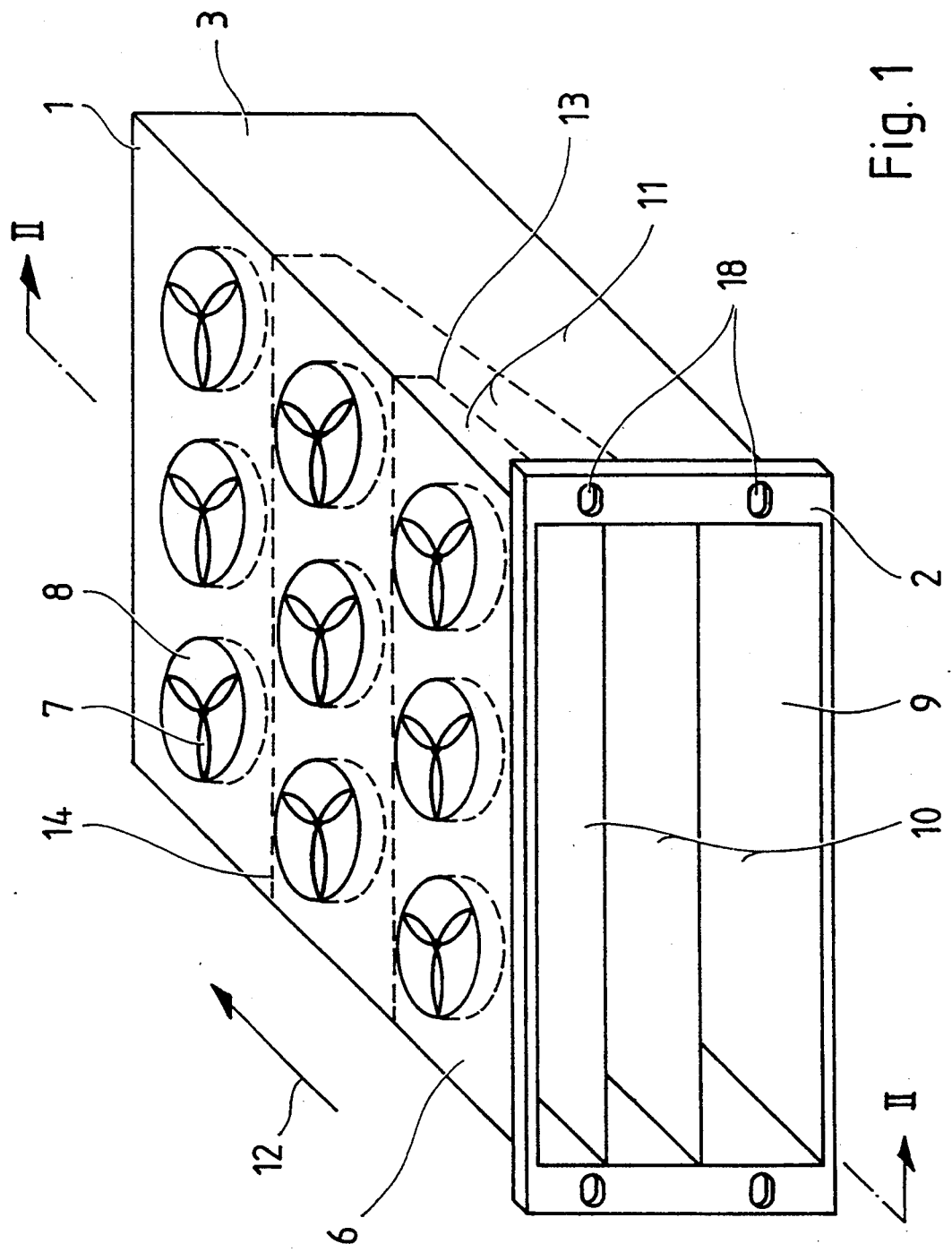
FIG. 1 is a schematic, perspective representation of a ventilator insert including nine axial blowers.
Figure 2:
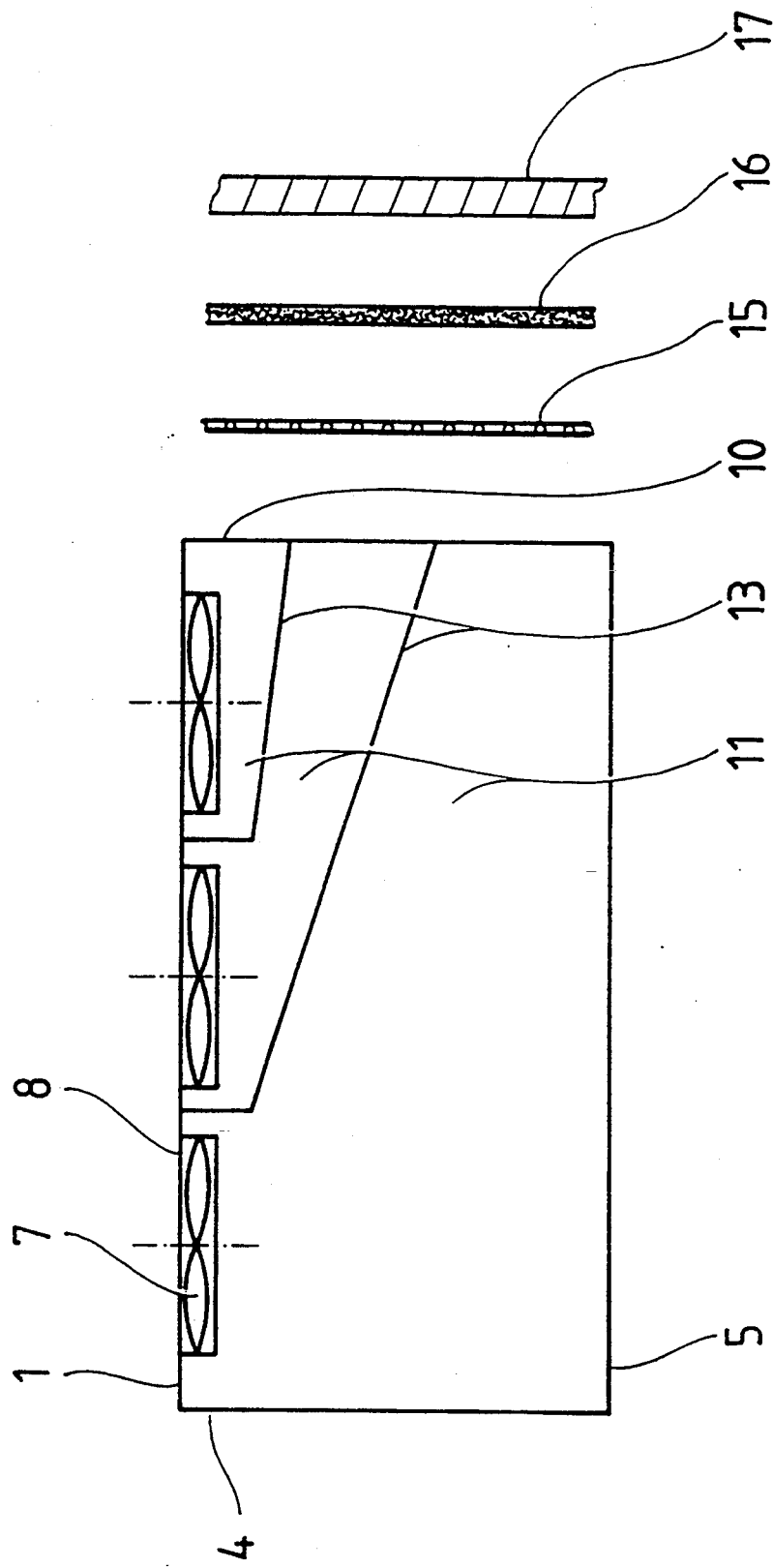
FIG. 2 is a vertical sectional view seen along line II—II of FIG. 1 of the ventilator insert of FIG. 1.

The ventilator insert shown in FIGS. 1 and 2 serves to cool electronic components in cabinets and racks.

The block-shaped ventilator insert (see FIG. 1) includes a cover plate 1, a front plate 2, two side walls 3, a rear wall 4 and a bottom plate 5 which constitute the ventilator housing 6.

The side walls 3 of ventilator housing 6 are arranged perpendicular to cover plate 1 and to front plate 2.

In the illustrated embodiment, the bottom plate 5 of ventilator housing 6 is attached parallel to cover plate 1; it could, however, also be arranged at an angle to cover plate 1.

Nine symmetrically arranged blowers 7 are inserted into the rectangular cover plate 1 of ventilator housing 6, forming rows and columns of three blowers 7 each. Blowers 7 are disposed underneath an equal number of circular outlet openings 8, and are arranged to be planar. The illustrated blowers 7 are axial blowers.

The front plate 2 of ventilator housing 6 includes an elongate rectangular inlet opening 9. Inlet opening 9 is subdivided into three superposed inlets 10. From each one of these inlets 10, a separate air intake channel 11 leads to one of the rows of blowers 7 arranged perpendicular to insertion direction 12. Each row is composed of three juxtaposed blowers 7.

The subdivision of ventilator housing 6 into three air intake channels 11 is again shown clearly in FIG. 2. This figure show the different size inlets 10 of air intake channels 11.

Air intake channels 11 in ventilator housing 6 have a rectangular cross section and are formed by partitions 13. These partitions 13 are composed of sheet metal plates that are angled off at their rear edges and lead from inlet opening 9 slightly ascending into the interior of ventilator housing 6. They are bent at approximately a right angle below parting lines 14 disposed between the rows of blowers 7 that are perpendicular to insertion direction 12 and then the partitions continue vertically upwardly. Partitions 13 are fastened to cover plate 1 and side walls 3.

The inlet opening 9 in front plate 2 is preceded by a grate 15 (see FIG. 2) and by a filter medium 16 as well as a laminar air flow guide 17.

Ventilator housing 6 is inserted into cabinets and racks and held by means of long fastening holes 18.

It will be understood that the above description of the present invention is susceptible to various modifications, changes and adaptations, and the same are intended to be comprehended within the meaning and range of equivalents of the appended claims.

What is claimed is:

1. A ventilator insert having an insertion direction, comprising:
    a ventilator housing having a cover plate and a front plate, said cover plate including an outlet opening and said front plate including an inlet opening;
    at least one partition positioned within said ventilator housing and forming a plurality of superposed air intake channels each having an inlet and each having an outlet at the outlet opening, each said inlet being superposed at the inlet opening; and
    at least two electric blowers positioned underneath said outlet opening and being arranged in a plane one behind the other in the insertion direction, each said blower being separately associated with a respective one of the air intake channels.

2. A ventilator insert as defined in claim 1, each of said electric blowers includes a front blower and a rear blower, and wherein each air intake channel has a respective entrance cross section, the entrance cross section of the air intake channel of each front blower being smaller than the entrance cross section of the air intake channel leading to each rear blowers.

3. A ventilator insert as defined in claim 1, wherein the blowers are axial blowers.

4. A ventilator insert as defined in claim 1, wherein a grate is provided upstream of the inlet opening.

5. A ventilator insert as defined in claim 1, wherein a filter medium is disposed upstream of the inlet opening.

6. A ventilator insert as defined in claim 1, wherein a laminar air flow guide is fastened upstream of the inlet opening.

7. A ventilator insert as defined in claim 1, further comprising an additional electric blower arranged in the plane and positioned transversely to the insertion direction, adjacent to one of aid at least two electric blowers, underneath the outlet opening, and associated with a respective air intake channel.

8. A ventilator insert as defined in claim 1, further comprising at least one additional air intake channel having an inlet positioned transversely to the insertion direction and adjacent to one of said superposed inlets and an outlet at the outlet openings; and an associated electric blower positioned underneath the outlet opening and arranged in the plane.

9. A ventilator insert having an insertion direction, comprising:
    a ventilator housing having a cover plate and a front plate, said cover plate including an outlet opening and said front plate including an inlet opening;
    a plurality of air intake channels within said housing each having an inlet at the inlet opening each having a respective inlet cross section, and an outlet at the outlet opening; and
    a front blower and a rear blower arranged relative to the insertion direction and being positioned underneath said outlet openings, each said blower being separately associated with a respective one of the air intake channels, the inlet cross section of the front blower air intake channel being smaller than the inlet cross section of the rear blower air intake channel.

* * * * *